(12) United States Patent
Park

(10) Patent No.: US 8,615,126 B2
(45) Date of Patent: Dec. 24, 2013

(54) METHOD FOR PERFORMING PATTERN DECOMPOSITION BASED ON FEATURE PITCH

(75) Inventor: Jung Chul Park, Pleasanton, CA (US)

(73) Assignee: ASML Masktools B.V., Veldhoven (NL)

( * ) Notice: Subject to any disclaimer, the term of this patent is extended or adjusted under 35 U.S.C. 154(b) by 0 days.

(21) Appl. No.: 13/170,126

(22) Filed: Jun. 27, 2011

(65) Prior Publication Data
US 2011/0317908 A1 Dec. 29, 2011

Related U.S. Application Data

(62) Division of application No. 11/898,648, filed on Sep. 13, 2007, now Pat. No. 7,970,198.

(60) Provisional application No. 60/844,079, filed on Sep. 13, 2006.

(51) Int. Cl.
*G06K 9/00* (2006.01)

(52) U.S. Cl.
USPC ........... 382/144; 382/145; 382/190; 382/199; 382/203; 382/260; 382/261; 382/263; 382/264; 382/276

(58) Field of Classification Search
USPC .................................................. 382/144–145
See application file for complete search history.

(56) References Cited

U.S. PATENT DOCUMENTS

| | | | | |
|---|---|---|---|---|
| 4,506,382 A * | 3/1985 | Hada et al. | ................ | 382/205 |
| 4,532,650 A * | 7/1985 | Wihl et al. | ................ | 382/144 |
| 4,849,679 A * | 7/1989 | Taft et al. | ................ | 318/577 |
| 5,113,565 A * | 5/1992 | Cipolla et al. | ................ | 29/25.01 |
| 5,969,441 A * | 10/1999 | Loopstra et al. | ................ | 310/12.06 |
| 6,046,792 A | 4/2000 | Van Der Werf et al. | | |
| 6,738,505 B1 * | 5/2004 | Prince | ................ | 382/150 |
| 7,173,732 B2 * | 2/2007 | Matama | ................ | 358/1.9 |
| 7,500,218 B2 * | 3/2009 | Troost et al. | ................ | 716/54 |
| 7,558,763 B2 * | 7/2009 | Zhao et al. | ................ | 706/14 |
| 7,970,198 B2 * | 6/2011 | Park | ................ | 382/144 |
| 8,340,394 B2 * | 12/2012 | Socha | ................ | 382/145 |
| 8,391,605 B2 * | 3/2013 | Hsu et al. | ................ | 382/181 |
| 2005/0276464 A1 * | 12/2005 | Duquette et al. | ................ | 382/151 |
| 2008/0037861 A1 * | 2/2008 | Nikolsky | ................ | 382/149 |
| 2008/0069432 A1 * | 3/2008 | Hsu et al. | ................ | 382/145 |
| 2008/0133625 A1 * | 6/2008 | Alexandru | ................ | 708/101 |
| 2008/0144969 A1 * | 6/2008 | Park | ................ | 382/276 |
| 2011/0229029 A1 * | 9/2011 | Kass | ................ | 382/168 |
| 2011/0317908 A1 * | 12/2011 | Park | ................ | 382/145 |

* cited by examiner

*Primary Examiner* — Gandi Thirugnanam
(74) *Attorney, Agent, or Firm* — Pillsbury Winthrop Shaw Pittman LLP

(57) ABSTRACT

The present invention discloses a method for decomposing a target pattern containing features to be printed on a wafer, into multiple patterns, the features having a plurality of patterns within a minimum pitch for processes utilized to image the target pattern. The method includes superposing a predefined kernel over a pixel, and moving the kernel from one pixel to another, the pixels representing the sub-patterns of the target pattern. Polarity of the kernel may be reversed when the pixel has a stored intensity value that is negative.

18 Claims, 8 Drawing Sheets

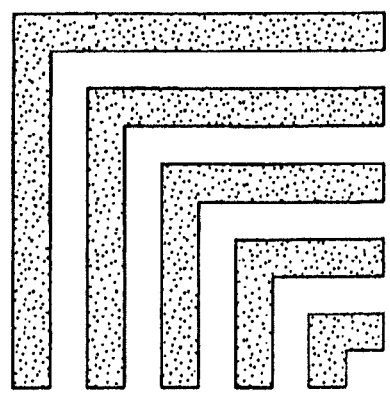
FIG. 3
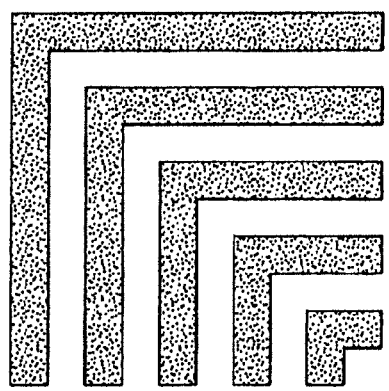
FIG. 4
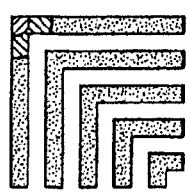 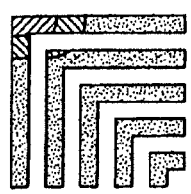 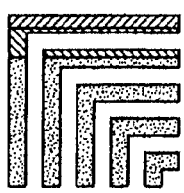 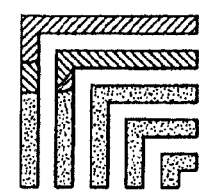 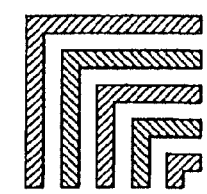
FIG. 5A    FIG. 5B    FIG. 5C    FIG. 5D    FIG. 5E

METHOD FOR PERFORMING PATTERN DECOMPOSITION BASED ON FEATURE PITCH

RELATED APPLICATIONS

This application is a divisional of U.S. patent application Ser. No. 11/898,648, filed on Sep. 13, 2007, issued as U.S. Pat. No. 7,970,198, which claims priority to U.S. Patent Application Ser. No. 60/844,079, filed on Sep. 13, 2006, both of which are incorporated by reference herein in their entirety.

TECHNICAL FIELD

The technical field of the present invention relates generally to a method, program product and apparatus for performing a decomposition of a target pattern into multiple patterns so as to allow the target pattern to be imaged utilizing, for example, multiple masks in a multiple illumination process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

For example, one commonly known double exposure technique is referred to as double-patterning or DPT. This technique allows the features of a given target pattern to be separated into two different masks and then imaged separately to form the desired pattern. Such a technique is typically utilized when the target features are spaced so closely together that it is not possible to image the individual features. In such a situation, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

Thus, by separating the target features into two separate masks, such that the pitch between each of the features on a given mask is above the resolution capabilities of the imaging system, it is possible to improve imaging performance. Indeed, the above-mentioned double exposure techniques allow for a $k_1<0.25$. However, problems and limitations still exist with currently known double exposure techniques.

For example, current decomposition techniques include rule-based decomposition techniques and model-based decomposition techniques. Rule-based methods typically require an excessive number of rules to handle today's increasingly complex designs. More specifically, with a set of pre-constructed geometric rules, it is possible to start performing pitch-split decomposition. This entails separating (also referred to as coloring) the odd and even pitch features into two separate geometry groups or patterns. Conceptually, this is straight forward process. However, in an actual IC circuit design, the local 2-dimensional geometry environment is very complex. As such, it is often difficult to identify "odd" and "even" pitch features from any of the localized dense pattern groups. As a result, the existing rule-based approach causes numerous coloring conflicts that need additional exceptional rules and/or operator intervention in order to resolve these conflicts. The need for such additional rules or operator invention make current rule-based systems very time consuming and problematic to utilize as often significant time must be taken to tailor the rule set to the given target design. Model-based decomposition processes also suffer from various disadvantages. For example, model-based decomposition methods can take an exceedingly long period of time to complete the decomposition process. Further, the model-based methods are also not immune from the non-resolvable conflict issues, and therefore can also require operator intervention, which is undesirable.

It is an object of the present invention to overcome such deficiencies in known rule-based and model-based pattern decomposition techniques.

SUMMARY OF THE INVENTION

In view of the foregoing, it is an object of the present invention to overcome the deficiencies of known prior art techniques by providing a simplified decomposition process that does not require the generation of an extensive rule-base set, and which is suitable for use with substantially any target pattern.

In summary, the present invention provides a method for decomposing a target pattern, containing features to be printed on a wafer, into multiple patterns.

As explained below in further detail, the process of the present invention provides numerous advantages over the known decomposition processes. Most importantly, the process provides for a quick and efficient method of decomposing the target pattern, and eliminates the need for the generation of a complicated set of rules to govern pattern decomposition. In addition, the process allows a given feature to be segments into multiple portions with the portions being disposed in separate patterns for imaging.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

BRIEF DESCRIPTION OF THE DRAWINGS

FIGS. 3-5e illustrate the decomposition process of the present invention with respect to an exemplary target pattern.

DETAILED DESCRIPTION OF THE INVENTION

As explained in further detail below, the decomposition process of present invention first entails defining a function or kernel, which has a different sign with respect to amplitude between the center of the kernel and an outer radius of the kernel. Importantly, the negative amplitude of the kernel should be located at a distance from the center of the kernel which corresponds to the pitch to be avoided in the pattern layout. Once the kernel is defined, as explained below in further detail, the kernel is sequentially placed on each pixel (the size of which is also predefined) of the target features, and during each placement of the kernel, the value of the kernel or function at the each pixel is added (or subtracted if the kernel value is negative) to the previous value of the pixel to generate a number value associated with the given pixel. This process is repeated until the kernel has been positioned on each pixel of each feature to be imaged. Once this process is completed, each pixel will have associated therewith either a positive value, a negative value or a zero value. As shown in the example below, the positive value pixels and negative value pixels tend to be grouped together. These positive and negative values are then utilized to separate/decompose the target features into a first pattern and a second pattern. More specifically, the pixels have a positive value are placed in the first pattern and pixels having a negative value are placed in a second pattern. The zero valued pixels may be placed in either pattern.

As noted above, the negative amplitude of the kernel should be located at a distance from the center of the kernel which corresponds to the pitch to be avoided in the pattern layout. In other words, the center of the kernel having a positive value can be deemed as corresponding to the minimum printable CD of the features, and distance from the center of the kernel to the negative value, which corresponds to the pitch to be avoided, can be deemed the area which is below the minimal acceptable pitch of the given photolithography process being utilized to image the target pattern. As such, the resulting pitch in the first and second patterns will be equal to or greater than the minimal acceptable pitch. It is noted that the minimum acceptable CD and minimum acceptable pitch (and the pitch to be avoided) for the process to be utilized to image the patterns can be determined utilizing empirical or simulation processes, which are well known in the art.

Figure 1:
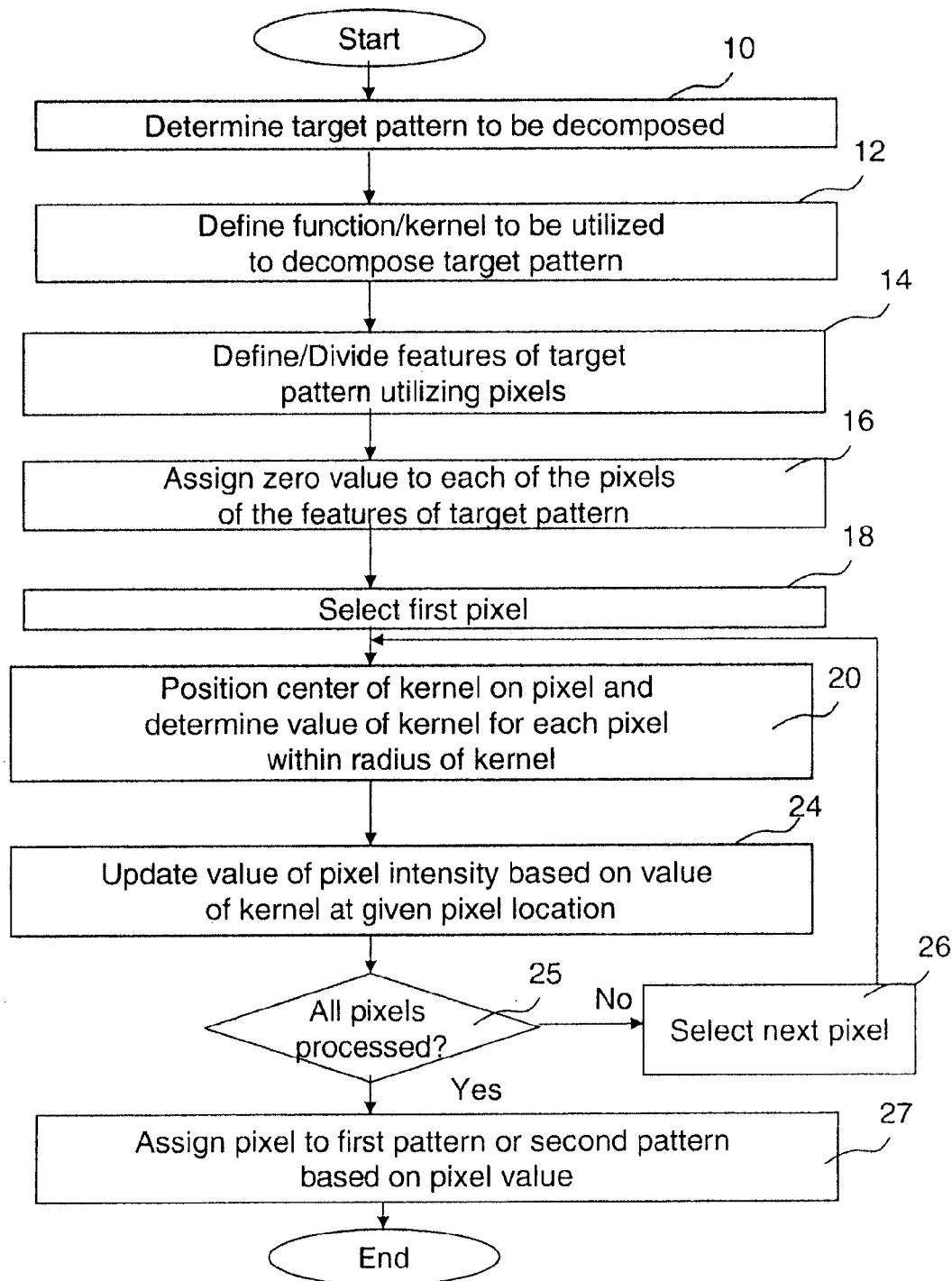
FIG. 1 is an exemplary flowchart illustrating the decomposition process of the present invention, which is utilized to decompose a target pattern into multiple patterns.

FIG. 1 is an exemplary flowchart illustrating a first embodiment of the present invention. Referring to FIG. 1, the first step (Step 10) in the process is to define the original target pattern to be decomposed into two or more patterns. In the given example, the target pattern includes a plurality of L-shaped lines as shown in FIG. 3.

Figure 2:
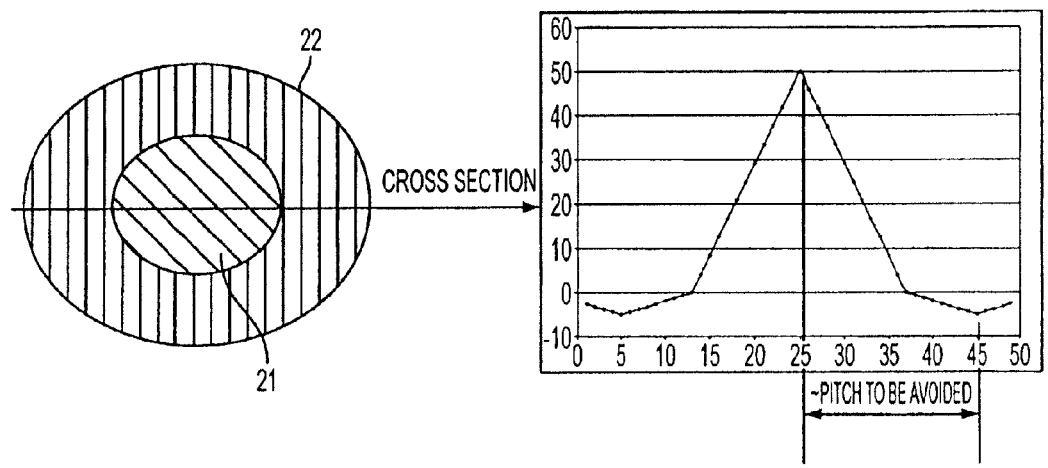
FIG. 2 illustrates an exemplary kernel which may be utilized in the model-based decomposition process set forth in FIG. 1.

The next step (Step 12) in the process is to define the kernel or function to be utilized in the decomposition process. As noted above, the kernel is a function which has a different sign with respect to amplitude between the center of the kernel and an outer radius of the kernel, where the outer radius exhibiting the change of amplitude corresponds to the pitch to be avoided (i.e., a pitch which is less than the minimum acceptable pitch). FIG. 2 illustrates an exemplary kernel which can be utilized in the process. Referring to FIG. 2, the kernel has a center section 21 having a positive function value and an outer section 22 having a negative function value. As noted, the kernel is selected such that the outer section 22 is placed at a distance corresponding to the pitch to be avoided. As also shown, the values of the kernel are the highest at the center of the kernel and decrease as the distance from the center increases. It is noted that the shape of the kernel is not limited to the example shown in FIG. 2. Any function which has a different sign in amplitude between the center of the kernel and at a set radius away from the center may be utilized. Further, it is also possible to have the center of the kernel exhibit a negative amplitude and have the outer radius corresponding to the pitch to be avoided exhibit a positive value. The important criteria being that there is a change of sign in amplitude between the two locations.

Once the kernel is defined, the next step in the process (Step 14), is to divide the features of the target pattern into pixels with proper size according to the design of the data format (e.g., GDSII) as shown in FIG. 4. It is noted that the pixel size can range from as small as the design grid permits to the minimum design line size (i.e., minimum CD). However, because the coloring is performed on pixel by pixel basis, if the pixel size is too small, it may take a longer time to complete the decomposition process. Alternatively, if the pixel size is too large, the decomposition process may result in a conflict situation. As such, the pixel size should be selected such that the features can be evenly divided. As an example, for a 32 nm CD target design, the pixel size may be on the order of 20 nm. Once this is accomplished, the next step (Step 16) entails initializing the value of all pixels of the target features to zero.

Next, in Step 18, a first pixel is selected. Then, the center of the kernel is placed/positioned on the first pixel (Step 20), and the value of the kernel at the corresponding pixel location is determined for all of the pixels within the diameter of the kernel. As shown, in FIG. 2, the amplitude value of the kernel changes as the distance from the center of the kernel increases. Thereafter (Step 24), the value of the kernel at the given pixel location is added or subtracted (if the kernel value is negative) to the current pixel intensity or value (all of which are initially set to zero) for all of the pixels within the diameter of the kernel. The process then proceeds to Step 25 where it is determined if the kernel has been placed on each of the pixels. If the answer is no, the process proceeds to Step 26 and selects the next pixel and then repeats Steps 20-25 until all of the pixels have been processed. It is noted that the value of the pixels is cumulative and is updated during each reiteration.

Once all of the pixels have been processed, in Step 27 the pixels are separated into either the first pattern or the second pattern based on whether the value of the given pixel is positive or negative. The first and second pattern can then be utilized to form first and second masks, which may be utilized in the multiple illumination process.

FIGS. 5a-5e illustrate the application of the foregoing decomposition process to the exemplary target pattern shown in FIG. 3. Initially, the kernel is placed on a first pixel in the upper corner of the pattern, and the kernel is overlaid on the target pattern, with the kernel being centered on the first pixel. The values of all of the pixels within the radius of the kernel function are updated. Specifically, when the value of the kernel at the location of the given pixel is position, the kernel value is added to the pixel value, and when the value of the kernel at the location of the given pixel is negative, the kernel value is subtracted from the pixel value. Once this is done, the kernel is moved to the next pixel and the process is repeated. Referring to FIGS. 5a-5e, it is shown that as the kernel is shifted over the pixels forming the target patterns, the features begin to be decomposed or separated from one another based in-part on the value of the pitch to be avoided, which is utilized to define the kernel. Once all of the pixels have been processed, the target pattern is completely decomposed. While it is not necessary to move the kernel from pixel-to-pixel in any particular order, in the given example, the kernel is moved in a raster manner. However, it is also possible to move the kernel in any other suitable pattern.

It is noted that the both the values of the pixels and the kernel may be maintained utilizing an x-y coordinate system so as to allow for ready identification and storage of the values of the pixels and kernel, as well as for ready placement of the kernel over the pixels. It is further noted that as a practical matter all pixels can be updated, however, the pixels outside of the kernel radius will simply be adding or subtracting a zero value from the current pixel value.

Figure 6:
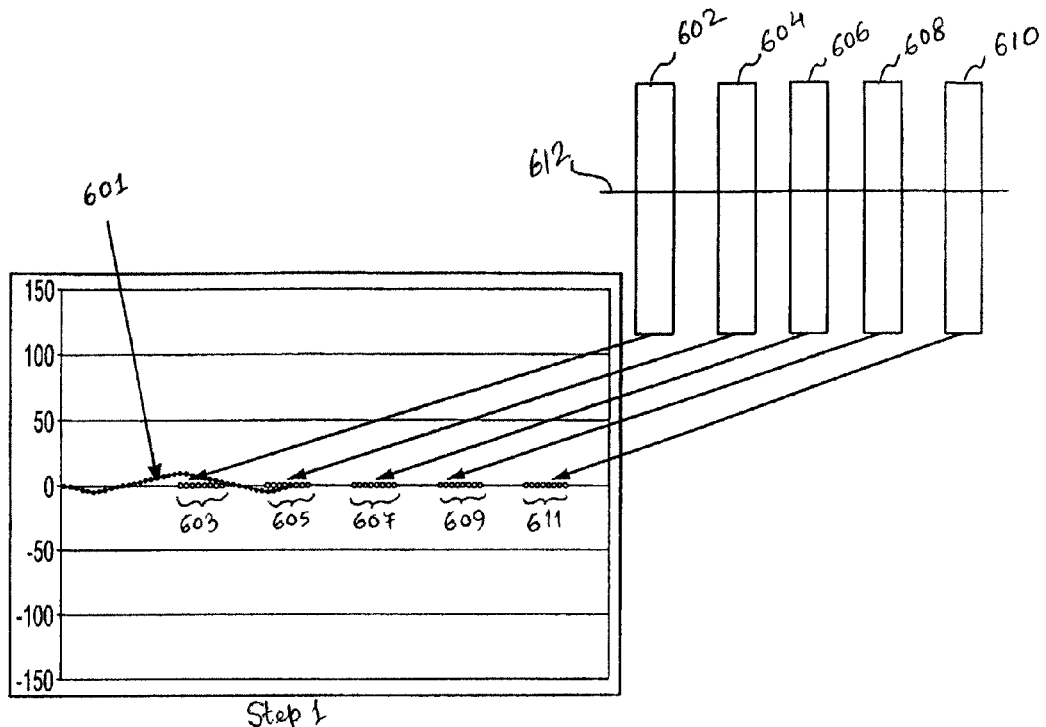
FIGS. 6-8 illustrate an example of the application of the decomposition process with respect to a line:space target pattern.
Figure 7:
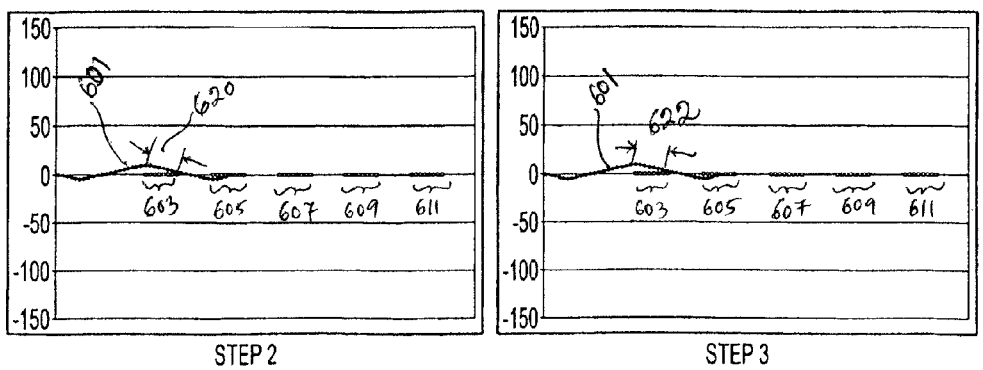
Figure 8:
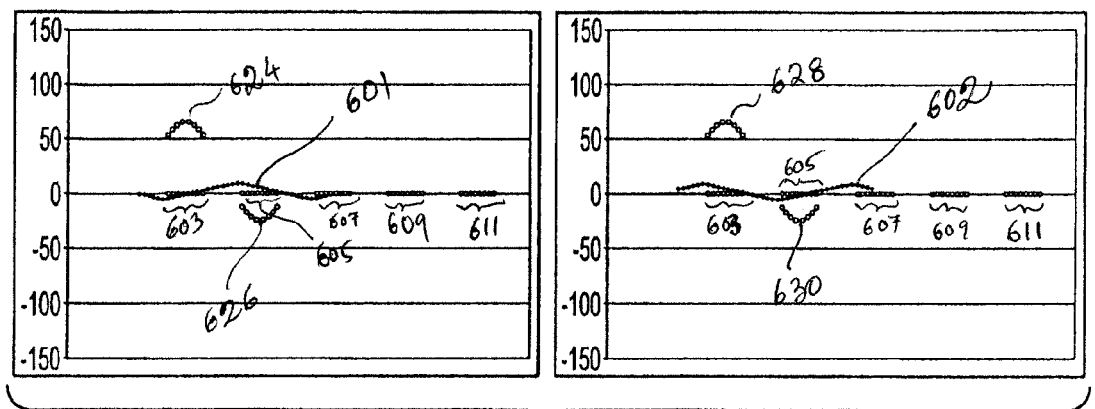

FIGS. 6-8 illustrate another example of the application of the decomposition process as applied to a line space pattern. The pixel values of the respective lines are shown when the kernel is initially positioned over the leftmost line 602. This can be thought of as step 1. In FIG. 6, cross section (along the line 612) of the line patterns 602, 604, 606, 608, and 610 are represented by pixel groups 603, 605, 607, 609, and 611, respectively. Referring to the graph 601 of FIG. 6, which represents the kernel intensity value, the pixel value associated with the first line 602 is positive, while the pixel value of the second line 604 (immediately to the right of the leftmost line 602) is negative. Again, as noted above, this is due to the predefined intensity values of the kernel which are selected so that features spaced below the minimal acceptable pitch are placed in separate patterns. FIGS. 7 and 8 are examples of how the values change as the kernel is shifted from pixel to pixel. In the left hand side plot in FIG. 7, labeled as step 2, the group of pixels indicated as 620 represents modified pixel intensity values for the group 603 when kernel intensity values are added to the original pixel intensity values. In step 2, the center of the kernel 601 is superposed on the center of the pixel group 603. In the right hand side plot in FIG. 7, labeled as step 3, the kernel 601 has been shifted by one pixel from the center of the pixel group 603. Further, in step 3, the pixel intensity value already assigned to the pixel is checked. If the pixel intensity value is greater than zero (or of a certain polarity), then kernel intensity value is added to the pixel intensity value, as in step 2. But, if the pixel intensity value is less than zero (or of an opposite polarity), then first the polarity if the kernel intensity value is flipped, and then the kernel intensity value is added to the pixel intensity value, as in step 2. The group of pixels indicated as 622 represents modified pixel intensity values for the group 603 with the kernel 601 is shifted by one pixel. Steps 2 and 3 are repeated until all the pixels are covered. The plots in FIG. 8 illustrates the reversal of polarity (or sign) of the kernel intensity value, as discussed in step 3 above. In the right hand plot of FIG. 8, it is shown that when the center of the kernel 601 is shifted to the second line 604, polarity of the kernel is changed. The kernel 602 is the modified kernel with flipped polarity with respect to kernel 601. Persons skilled in the art will understand in view of the present methodology that since the second line 604 has a sum value of intensity less than zero, flipping of kernel was done, according to step 3 rules, as discussed before. 624 and 628 represent modified pixel intensity values corresponding to pixel group 603 (line 602), and, 626 and 630 represent modified pixel intensity values corresponding to pixel group 605 (line 604).

Figure 9:
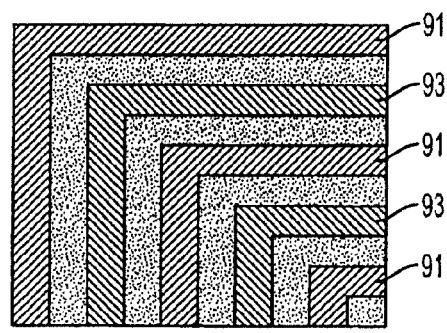
FIGS. 9 and 10 illustrate other examples of the decomposition process being applied to target patterns.
Figure 10:
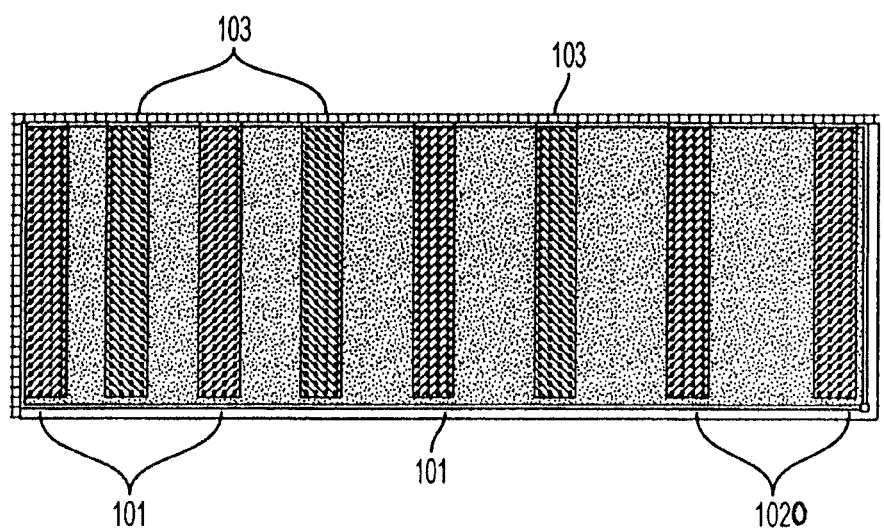

Finally, FIG. 9 illustrates the result of the decomposition process being applied to an elbow pattern. The result, which is the same as shown in FIG. 5e, is that the pattern is decomposed into patterns, the first pattern including features 91 and the second pattern including features 93. FIG. 10 illustrates the result of the decomposition process being applied to a line space pattern having densely spaced features 101 and 103 and non-dense features 1020. As shown, the result is that the densely spaced features (i.e., features 101 and 103) are separated into separate patterns, while the non-densely spaced patterns are left unchanged.

As detailed above, the process of the present invention provides numerous advantages over the known decomposition processes. Most importantly, the process provides for a quick and efficient method of decomposing the target pattern, and eliminates the need for the generation of a complicated set of rules to govern pattern decomposition.

Variations of the exemplary process detailed above are also possible. For example, it is possible to apply optical proximity correction treatments to the decomposed patterns resulting from the process of the present invention. Further, either rule-based or model-based OPC treatments may be utilized on the decomposed patterns.

In yet another variation, different functions, other than the one disclosed above, may be utilized to represent the kernel in the decomposition process. Again, the important aspect is that the function have a different sign in amplitude between the center of the function and the radius corresponding to the undesirable pitch, which is to be avoided.

Figure 11:
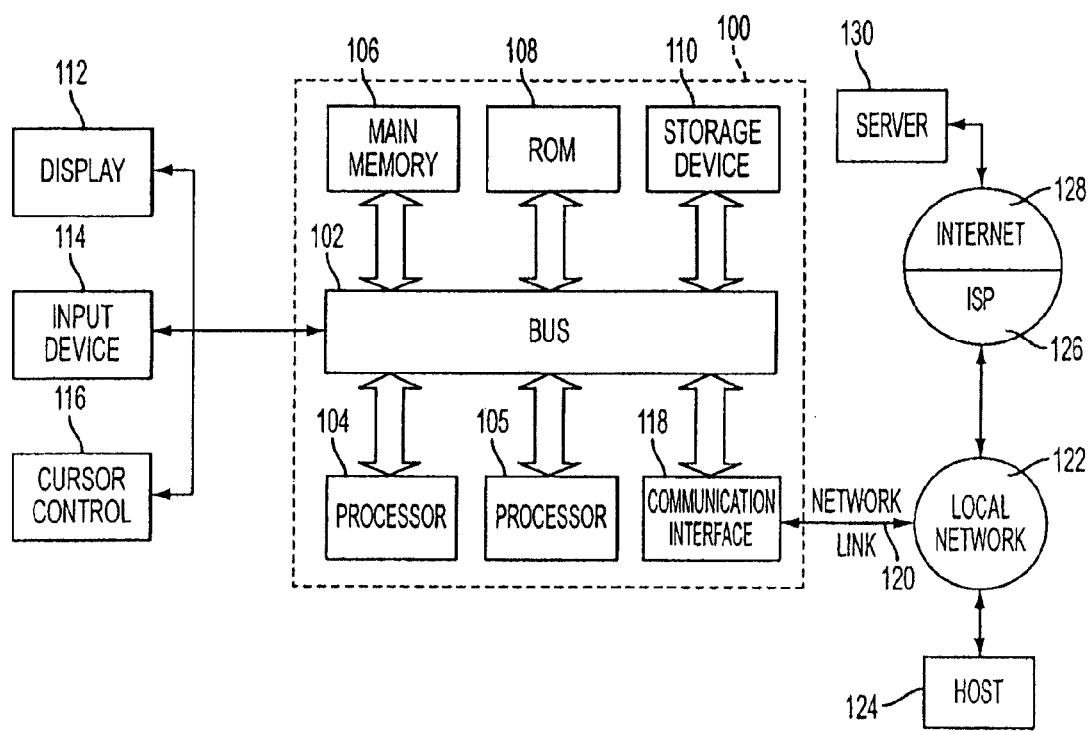
FIG. 11 is a block diagram that illustrates a computer system which can implement illumination optimization according to an embodiment of the present invention.

FIG. 11 is a block diagram that illustrates a computer system 100 which can implement the pattern decomposition process detailed above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104.

Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
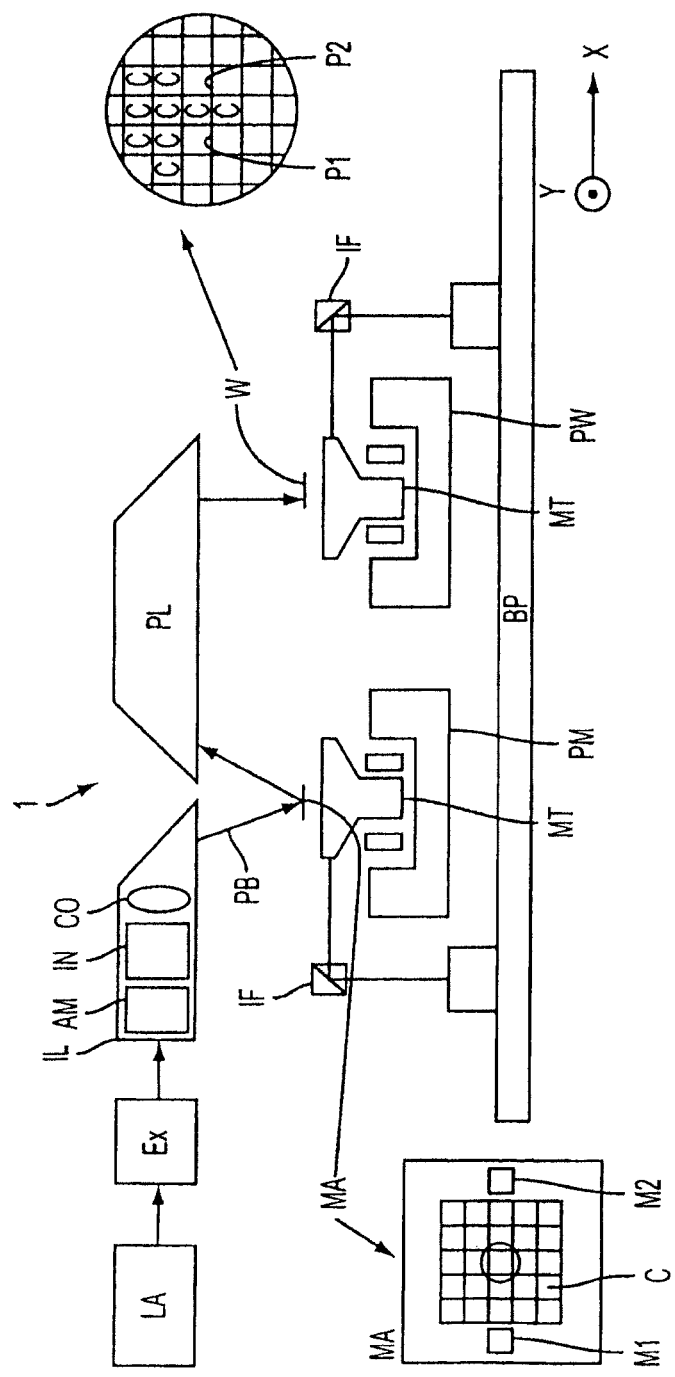
FIG. 12 schematically depicts an exemplary lithographic projection apparatus suitable for use with a mask designed with the aid of the disclosed concepts.

FIG. 12 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short-stroke actuator, or may be fixed.

The depicted tool can be used in two different modes:
- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution. Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for decomposing a target pattern, containing features to be printed on a wafer, into multiple patterns, wherein processes utilized to image the target pattern have a minimum pitch, the method comprising the steps of:
    (a) defining a first kernel for use in the decomposing, the first kernel representing a function having a first value having a first sign at a center, and a second value having a second sign which is a sign opposite to the first sign at a distance more than a first distance from the center and less than a second distance from the center, wherein the first distance corresponds to a minimum printable critical dimension of the features, and wherein the second distance corresponds to the minimum pitch;
    (b) defining the features utilizing a plurality of pixels;
    (c) disposing the first kernel over a pixel of the plurality of pixels, such that the center of the first kernel is located on the pixel if a value stored for the pixel has the first sign, and, disposing a second kernel in which the first and second signs of the first and second values are reversed with respect to the first kernel over the pixel, such that the center of the second kernel is located on the pixel if the value stored for the pixel has the second sign;
    (d) determining the first value or the second value of the disposed kernel at the corresponding location of the pixel and for adjacent ones of the plurality of pixels that are located between the first distance and the second distance from the pixel;
    (e) storing a value for the pixel and each of the adjacent ones of the plurality of pixels by adding a previously stored pixel value to the value determined in step (d);
    (f) repeating steps (c)-(e) until each of the plurality of pixels has been processed; and
    (g) assigning a pattern formed by pixels of which the stored pixel value has the first sign to a first pattern, and assigning a pattern formed by pixels of which the stored pixel value has the second sign to a second pattern.

2. The method of claim 1, wherein the first kernel is moved sequentially from one pixel to another pixel of the plurality of pixels.

3. The method of claim 2, wherein the respective signs of the first value and the second value of the first kernel are reversed to generate the second kernel if the value stored for the pixel over which the center of the first kernel has moved to has the second sign.

4. The method of claim 1, wherein the first kernel comprises an annular cross section with the first value with the first sign within an inner radius and the second value with the second sign between the inner radius and an outer radius.

5. The method of claim 4, wherein the inner radius corresponds to the minimum printable critical dimension of the features, and the outer radius corresponds to the minimum pitch.

6. The method of claim 1 wherein an initial value of each pixel of the plurality of pixels is set to zero before disposing the first kernel.

7. A non-transitory computer-readable storage medium storing a computer program product for decomposing a target pattern, containing features to be printed on a wafer, into multiple patterns, wherein processes utilized to image the target pattern have a minimum pitch, the computer program, when executed, causing a computer to perform the steps of:
    (a) defining a first kernel for use in the decomposing, the first kernel representing a function having a first value having a first sign at a center, and a second value having a second sign which is a sign opposite to the first sign at a distance more than a first distance from the center and less than a second distance from the center, wherein the first distance corresponds to a minimum printable critical dimension of the features, and wherein the second distance corresponds to the minimum pitch;
    (b) defining the features utilizing a plurality of pixels;
    (c) disposing the first kernel over a pixel of the plurality of pixels, such that the center of the first kernel is located on the pixel if a value stored for the pixel has the first sign, and, disposing a second kernel in which the first and second signs of the first and second values are reversed with respect to the first kernel over the pixel, such that the center of the second kernel is located on the pixel if the value stored for the pixel has the second sign;
    (d) determining the first value or the second value of the disposed kernel at the corresponding location of the pixel and for adjacent ones of the plurality of pixels that are located between the first distance and the second distance from the pixel;
    (e) storing a value for the pixel and each of the adjacent ones of the plurality of pixels by adding a previously stored pixel value to the value determined in step (d);
    (f) repeating steps (c)-(e) until each of the plurality of pixels has been processed; and
    (g) assigning a pattern formed by pixels of which the stored pixel value has the first sign to a first pattern, and assigning a pattern formed by pixels of which the stored pixel value has the second sign to a second pattern.

8. The computer program product of claim 7, wherein the first kernel is moved sequentially from one pixel to another pixel of the plurality of pixels.

9. The computer program product of claim 8, wherein the respective signs of the first value and the second value of the first kernel are reversed to generate the second kernel if the value stored for the pixel over which the center of the first kernel has moved to has the second sign.

10. The computer program product of claim 7, wherein the first kernel comprises an annular cross section with the first value with the first sign within an inner radius and the second value with the second sign between the inner radius and an outer radius.

11. The method of claim 10 wherein the inner radius corresponds to the minimum printable critical dimension of the features, and the outer radius corresponds to the minimum pitch.

12. The method of claim 7, wherein an initial value of each pixel of the plurality of pixels is set to zero before disposing the first kernel.

13. A method for generating masks to be utilized in a photolithography process, said method comprising the steps of:
   (a) defining a first kernel for use in the decomposing, the kernel representing a function having a first value having a first sign at a center, and a second value having a second sign which is a sign opposite to the first sign at a distance more than a first distance and less than a second distance from the center, wherein the first distance corresponds to a minimum printable critical dimension of the features and the second distance corresponds to a minimum pitch of the photolithography process;
   (b) defining the features utilizing a plurality of pixels;
   (c) disposing the first kernel over a pixel of the plurality of pixels, such that the center of the first kernel is located on the pixel if a value stored for the pixel has the first sign, and, disposing a second kernel in which the first and second signs of the first and second values are reversed with respect to the first kernel over the pixel, such that the center of the second kernel is located on the pixel if the value stored for the pixel has the second sign;
   (d) determining the first value or the second value of the disposed kernel at the corresponding location of the pixel and for adjacent ones of the plurality of pixels that are located between the first distance and the second distance from the pixel;
   (e) storing a value for the pixel and each of the adjacent ones of the plurality of pixels by adding a previously stored pixel value to the value determined in step (d);
   (f) repeating steps (c)-(e) until each of the plurality of pixels has been processed;
   (g) assigning a pattern formed by pixels of which the stored pixel value has the first sign to a first pattern, and assigning a pattern formed by pixels of which the stored pixel value has the second sign to a second pattern; and
   (h) generating a first mask corresponding to the first pattern and a second mask corresponding to the second pattern.

14. The method of claim 13, wherein the first kernel is moved sequentially from one pixel to another pixel of the plurality of pixels.

15. The method of claim 14, wherein the respective signs of the first value and the second value of the first kernel are reversed to generate the second kernel if the value stored for the pixel over which the center of the first kernel has moved to has the second sign.

16. The method of claim 13, wherein the first kernel comprises an annular cross section with the first value with the first sign within an inner radius and the second value with the second sign between the inner radius and an outer radius.

17. The method of claim 16, wherein the inner radius corresponds to the minimum printable critical dimension of the features, and the outer radius corresponds to the minimum pitch.

18. The method of claim 13, wherein an initial value of each pixel of the plurality of pixels is set to zero before disposing the first kernel.

* * * * *